United States Patent
Kang et al.

(10) Patent No.: US 10,012,716 B2
(45) Date of Patent: Jul. 3, 2018

(54) MAGNETIC RESONANCE IMAGING METHOD AND APPARATUS

(71) Applicant: Siemens Aktiengesellschaft, Munich (DE)

(72) Inventors: Yuan Yuan Kang, Shenzhen (CN); Qiong Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 741 days.

(21) Appl. No.: 14/573,446

(22) Filed: Dec. 17, 2014

(65) Prior Publication Data

US 2015/0168526 A1  Jun. 18, 2015

(30) Foreign Application Priority Data

Dec. 17, 2013 (CN) .......................... 2013 1 0694579

(51) Int. Cl.
  *G01V 3/00* (2006.01)
  *G01R 33/561* (2006.01)
(52) U.S. Cl.
  CPC ...... *G01R 33/5611* (2013.01); *G01R 33/5615* (2013.01)

(58) Field of Classification Search
  CPC .................................................. G01R 33/5611
  USPC ........................................ 324/309, 307, 306
  See application file for complete search history.

(56) References Cited

U.S. PATENT DOCUMENTS

| | | | |
|---|---|---|---|
| 9,297,873 B2 * | 3/2016 | Block | G01R 33/5611 |
| 2013/0099784 A1 * | 4/2013 | Setsompop | G01R 33/54 |
| | | | 324/309 |
| 2016/0033607 A1 * | 2/2016 | Sun | G01R 33/5616 |
| | | | 324/309 |

* cited by examiner

*Primary Examiner* — Louis Arana
(74) *Attorney, Agent, or Firm* — Schiff Hardin LLP

(57) ABSTRACT

In an MRI method and apparatus a 3D magnetic resonance scan sequence is performed to acquire MR raw data, which are entered into k-space with 2D CAIPIRINHA undersampling. The sampled data are reorganized into data blocks that each contain one sampled k-space location. The data blocks are extracted from k-space in a predetermined sequence, and image data are reconstructed from the k-space data respectively in the extracted data blocks. The application of the 2D CAIPIRINHA undersampling method with corresponding reorganized data blocks into a 3D scan sequence, in particular a SPACE scan sequence, significantly improves the comfort of an examination subject as well as the overall image quality thereof.

6 Claims, 4 Drawing Sheets

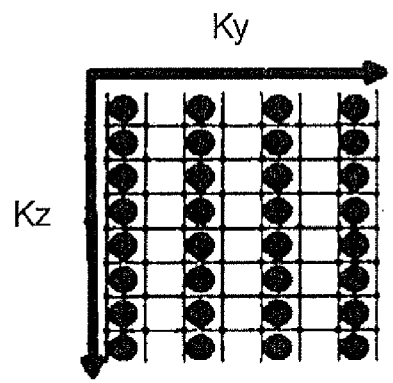 
*FIG. 1A*  *FIG. 1B*
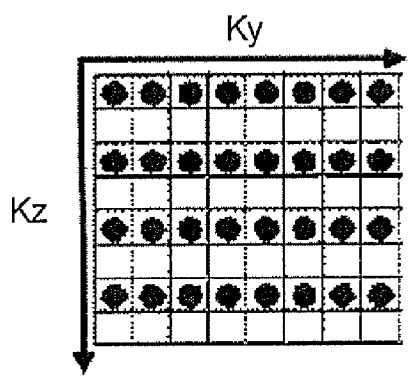 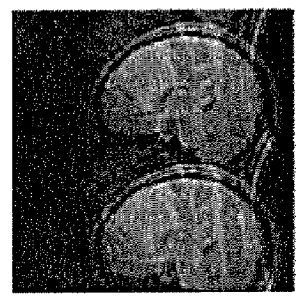
*FIG. 2A*  *FIG. 2B*
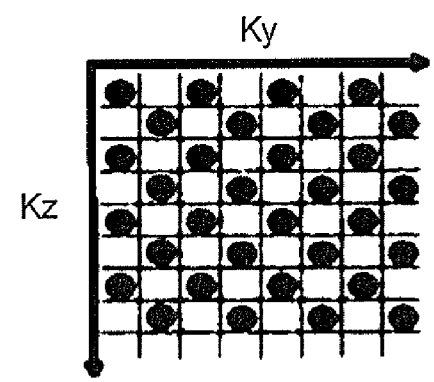 
*FIG. 3A*  *FIG. 3B*

MAGNETIC RESONANCE IMAGING METHOD AND APPARATUS

BACKGROUND OF THE INVENTION

Field of the Invention

The present invention relates to the technical field of magnetic resonance imaging, in particular to a three-dimensional magnetic resonance imaging method and apparatus.

Description of the Prior Art

Magnetic resonance imaging (MRI) is a technology in which the phenomenon of magnetic resonance is utilized for the purpose of imaging. The main principles of magnetic resonance are as follows. When an atomic nucleus contains a single proton, as is the case for example with the nuclei of the hydrogen atoms that are present throughout the human body, this proton exhibits spin motion and resembles a small magnet. Moreover, the spin axes of these small magnets lack a definite pattern, and if an external magnetic field is applied, the small magnets will be rearranged according to the magnetic force lines of the external magnetic field; specifically, they will line up in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis; the atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, and resonance occurs—this is the phenomenon of magnetic resonance. Once the spin axes of the excited atomic nuclei have deviated from the positive or negative longitudinal axis, the atomic nuclei have a transverse magnetization component.

Once emission of the RF pulse has ended, the excited atomic nuclei emit an echo signal, gradually releasing the absorbed energy in the form of electromagnetic waves, such that their phases and energy levels both return to the pre-excitation state. An image can be reconstructed by subjecting the echo signal emitted by atomic nuclei to further processing, such as spatial encoding.

With regard to three-dimensional (3D) MRI scanning methods, the prior art performs parallel encoding in two encoding directions (i.e. two-dimensional parallel imaging). Thus, sensitivity variation in two encoding directions can be used to reconstruct an image, e.g. the 2D SENSE undersampling method and the 2D GRAPPA undersampling method. It has been demonstrated in practice that these two undersampling methods can significantly increase the quality of the reconstructed image and speed up image reconstruction. However, these two undersampling methods need sufficient sensitivity variation in the two encoding directions in order to successfully reconstruct an image, and for this reason, the two undersampling methods are seriously reliant upon the distribution of the coils. In addition, the standard 2D SENSE and 2D GRAPPA undersampling methods employ a rectangular undersampling model, which is implemented in each direction by means of a simple integer sampling reduction.

As is known, the acquired MR raw data are entered into a memory organized as k-space. A number of points or locations in the memory (i.e., in k-space) are available to be filled with the acquired MR data. A filled k-space location is considered to be "sampled." Undersampling k-space is known, which means that some location in k-space, which are available to be filled with the raw MR data, are not sampled, i.e., a data entry is not made at that particular k-space location.

FIG. 1A is a schematic diagram of a two-dimensional (2D) SENSE undersampling method model for k-space data according to the prior art; FIG. 1B is an image reconstructed according to the undersampling model of FIG. 1A. FIG. 2A is a schematic diagram of a 2D GRAPPA undersampling method model for k-space data according to the prior art; FIG. 2B is an image reconstructed according to the undersampling model of FIG. 2A. As FIG. 1A shows, in a 2D SENSE undersampling method for k-space data according to the prior art, k-space data is undersampled in the Ky direction, i.e. every second datum is read in the Ky direction (a round dot represents a datum that is read). As FIG. 1B shows, if undersampling is performed according to the model shown in FIG. 1A (i.e. undersampling in the Ky direction), artefacts will appear in the image in the Ky direction. By the same principle, as FIG. 2A shows, in a 2D GRAPPA undersampling method for k-space data according to the prior art, k-space data is undersampled in the Kz direction, i.e. every second datum is read in the Kz direction (a round dot represents a datum that is read). As FIG. 2B shows, if undersampling is performed according to the model shown in FIG. 2A (i.e. undersampling in the Kz direction), artifacts will appear in the image in the Kz direction.

In summary, artifacts will be produced if a standard 2D SENSE undersampling method or 2D GRAPPA undersampling method is used for image reconstruction in a 3D fast spin echo sequence according to the prior art.

SUMMARY OF THE INVENTION

In accordance with the invention, an MRI apparatus is operated so as to execute a 3D MR scan sequence in order to acquire raw MR data. The acquired raw MR data are entered into k-space with 2D CAIPIRINHA undersampling, so as to produce undersampled k-space data, meaning that only some of the available locations for data entry in k-space are actually filled (sampled) with raw MR data. The 2D CAIPIRINHA undersampling has an acceleration factor in the phase encoding direction and, based on this acceleration factor, the undersampled k-space data are reorganized in k-space into multiple basic parallel reconstruction data extraction units, wherein each basic parallel reconstruction data extraction unit contains one sampled k-space location (i.e., one k-space location that has been filled with an acquired MR data entry). The k-space data are extracted from k-space in a predetermined sequence of the multiple basic parallel reconstruction data extraction units and the respective k-space data from the units extracted according to the predetermined sequence are used to reconstruct image data. The raw MR data are acquired by the MRI apparatus under the control of a computer, which also controls the entry of the raw MR data into k-space, and reorganizes the k-space data and extracts the k-space data in order to reconstruct the image data. The image data are thus made available from the computer in electronic form, as a data file.

Preferably, the 3D magnetic resonance scan sequence comprises a 3D time of flight spoiled gradient echo scan sequence or a 3D fast spin echo scan sequence.

Preferably, the phase encoding direction comprises a first phase encoding direction and a second phase encoding direction, and the basic parallel reconstruction data extraction unit is a matrix of a number of k-space data equal to an acceleration factor in the first phase encoding direction x a number of k-space data equal to an acceleration factor in the second phase encoding direction.

The present invention provides a 3D MRI apparatus, comprising the following components: a scanning and acquisition device, for performing a 3D magnetic resonance scan sequence and acquiring multiple k-space data; an undersampling and extraction device, for using a 2D CAIPIRINHA undersampling method on the k-space data to extract multiple sampling data; and an image reconstruction device, for using the sampling data to reconstruct a magnetic resonance image.

Preferably, the 3D magnetic resonance scan sequence comprises a 3D time of flight spoiled gradient echo scan sequence or a 3D fast spin echo scan sequence.

Preferably, the undersampling and extraction device comprises: a data reorganizing component, for reorganizing k-space data into multiple basic parallel reconstruction data extraction units on the basis of an acceleration factor of the 2D CAIPIRINHA undersampling method in a phase encoding direction, wherein each basic parallel reconstruction data extraction unit comprises one of the sampling data; and a data extraction component, for extracting the multiple basic parallel reconstruction data extraction units in a predetermined sequence.

Preferably, the phase encoding direction comprises a first phase encoding direction and a second phase encoding direction, and the basic parallel reconstruction data extraction unit is a matrix of a number of k-space data equal to an acceleration factor in the first phase encoding direction x a number of k-space data equal to an acceleration factor in the second phase encoding direction.

It is clear from the above solution that since staggering is carried out in the PE or SL direction when the 2D CAIPIRINHA undersampling method is applied to a 3D scan sequence, aliasing in parallel imaging can be controlled, so that a greater area in the center of the field of view (FOV) is undisturbed by aliasing. At the same time, coil sensitivity is increased, enabling further acceleration. Thirdly, the 2D CAIPIRINHA undersampling method generally uses a small acceleration factor, thereby ensuring a high signal to noise ratio. Finally, when the 2D CAIPIRINHA undersampling method is used in an MRI method carried out using a 3D fast spin sequence scan, the time taken to extract k-space data is significantly reduced, thereby shortening the scan time, while the use of "data block" reorganization improves image quality.

In short, according to the embodiments of the present invention, the application of the 2D CAIPIRINHA undersampling method with corresponding reorganized "data blocks" to a 3D scan sequence, in particular a SPACE scan sequence, significantly improves the comfort of an examination subject as well as the overall image quality thereof.

BRIEF DESCRIPTION OF THE DRAWINGS

FIG. 1A is a schematic diagram of a model for undersampling k-space data in the Ky direction according to the prior art.

FIG. 1B is an image reconstructed according to the undersampling model of FIG. 1A.

FIG. 2A is a schematic diagram of a model for undersampling k-space data in the Kz direction according to the prior art.

FIG. 2B is an image reconstructed according to the undersampling model of FIG. 2A.

FIG. 3A is a schematic diagram of a model for undersampling k-space data according to a specific embodiment of the present invention.

FIG. 3B is an image reconstructed according to the undersampling model of FIG. 3A.

DESCRIPTION OF THE PREFERRED EMBODIMENTS

The present invention is explained in further detail below by way of specific embodiments, to explain the object, technical solution and advantages thereof.

The core of the technical solution of a 3D MRI method according to a specific embodiment of the present invention consists in applying a 2D CAIPIRINHA method to k-space data obtained by a 3D scan sequence, i.e. controlling aliasing in 2D parallel imaging by means of a modified phase encoding strategy. Specifically, the modified phase encoding strategy is formed by staggering the sampling positions in a sampled 2D phase encoding pattern. This is referred to as the modified sampling strategy hereinafter. In a multi-dimensional scan sequence, the modified sampling strategy can make coil sensitivity variation more efficient, and thereby make the reconstruction conditions in parallel imaging more stable, so as to generate an image of higher quality.

With regard to scan sequences, 3D MRI scan sequences include 3D time of flight spoiled gradient echo (3D-TOF-SPGR) sequences and 3D fast spin echo (Three Dimensional Turbo Spin-Echo, SPACE) sequences, etc., of which the 3D fast spin echo (Three Dimensional Turbo Spin-Echo, SPACE) sequences are the more typical scan sequences. To illustrate the technical solution of the present invention, as an example, a 3D fast spin echo sequence is used in the 3D MRI method according to a specific embodiment of the present invention. However, as stated above, the 3D MRI method is not limited to a 3D fast spin echo sequence.

Figure 4:
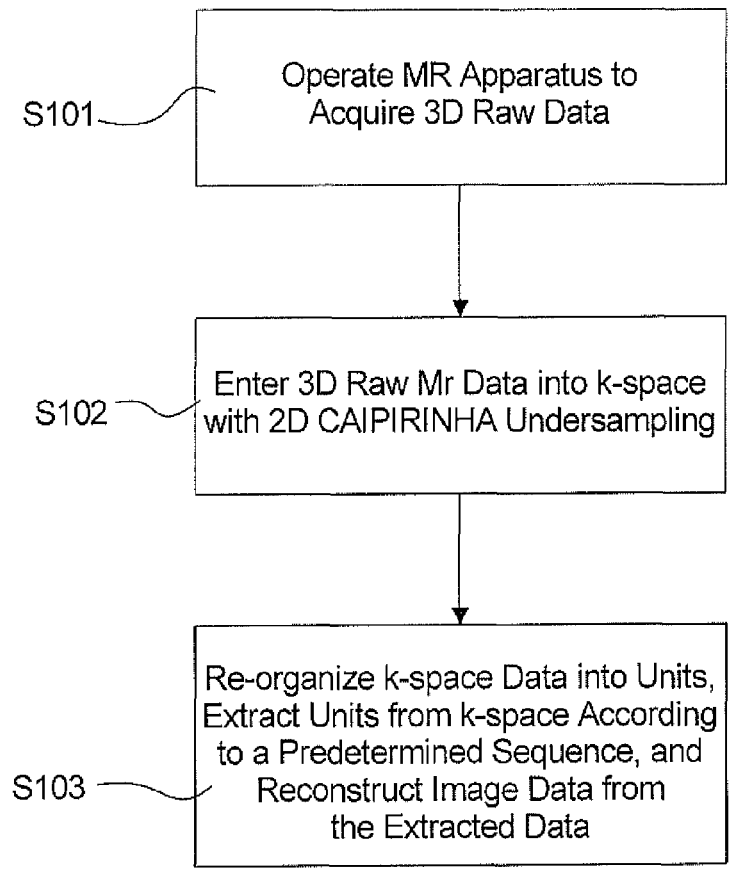
FIG. 4 is a diagram of the steps of the 3D MRI method according to a specific embodiment of the present invention.
Figure 8:
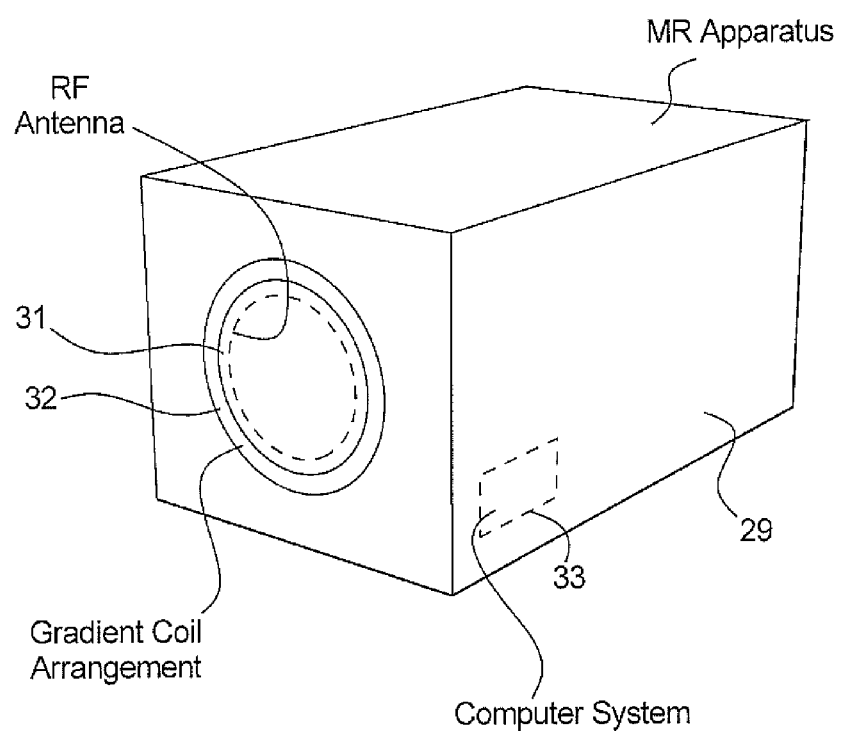
FIG. 8 schematically illustrates an MRI system in accordance with the invention.

FIG. 4 is a diagram of the steps of the 3D MRI method according to a specific embodiment of the present invention. As FIG. 4 shows, also referring to FIG. 8, the 3D MRI method according to this embodiment of the present invention includes, in step S101, operating an MRI apparatus 29 with a computer so as to perform a 3D fast spin echo scan and thereby acquire raw MR data. Specifically, in the 3D fast spin echo sequence, first a 90° excitation RF pulse is applied by an RF antenna 31. After the 90° excitation RF pulse, a 180° rephasing pulse RF pulse is applied; other subsequent RF pulses are then applied; and a slice-select gradient Gs, phase encoding gradient $G_p$ and readout gradient $G_r$ are applied in a slice-select gradient direction, phase encoding gradient direction and readout gradient direction, respectively, by a gradient coil arrangement 32. During the scan, an analog to digital converter ADC of a computer system 33 acquires a signal, wherein the analog to digital converter ADC acquires an echo signal in the data acquisition timeslots ACST indicated by the shaded areas, and generates k-space data.

Next, as also shown in FIG. 4, the 3D MRI method according to this embodiment of the invention includes, in step S102, entering the acquired MR raw data into k-space with 2D CAIPIRINHA undersampling so as to produce sampled data in k-space. Because of the 2D CAIPIRINHA undersampling, not every location in k-space, which is available for making a data entry thereat, is actually sampled (filled with a data entry). The 2D CAIPIRINHA undersampling has an acceleration factor in a phase encoding direction.

In step S103 shown in FIG. 4, the undersampled data in k-space are reorganized into multiple basic parallel reconstruction data extraction units on the basis of the acceleration factor of the 2D CAIPIRINHA undersampling. Each basic parallel reconstruction data extraction unit contains one sampled location of k-space. The multiple basic parallel reconstruction data extraction units are extracted from k-space in a predetermined sequence, and the respective individual k-space data entries in those extracted units are used in the computer to reconstruct image data, which are then made available from the computer in electronic form, as a data file.

Figure 5:
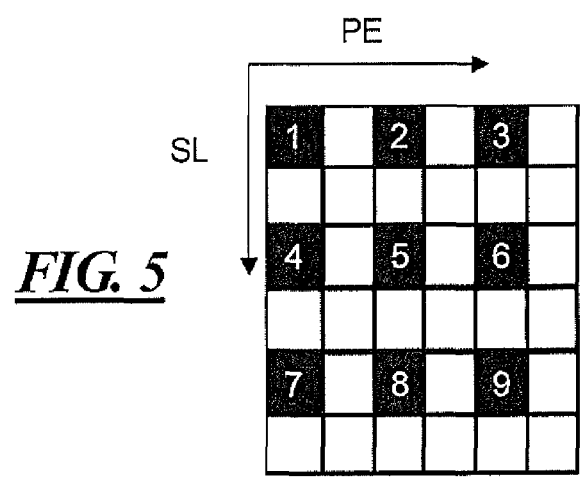
FIG. 5 is a schematic diagram of a 2D GRAPPA undersampling method used in a 3D MRI method in the prior art.
Figure 6:
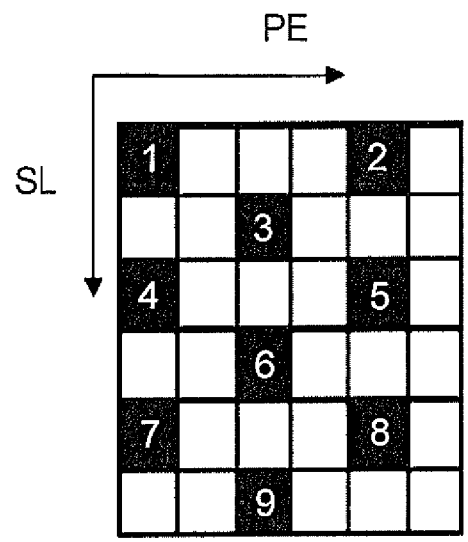
FIG. 6 is a schematic diagram of a first 2D CAIPIRINHA undersampling method used in a 3D MRI method according to a specific embodiment of the present invention.
Figure 7:
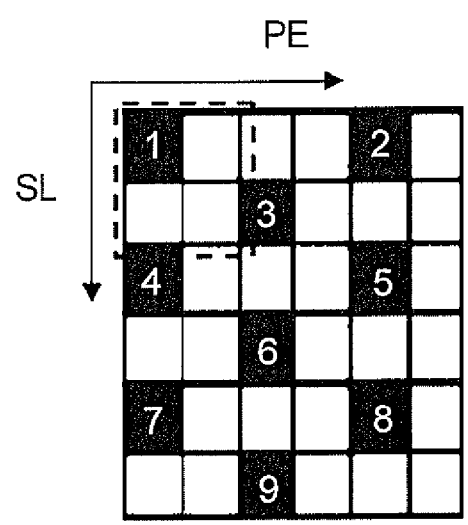
FIG. 7 is a schematic diagram of a second 2D CAIPIRINHA undersampling method used in a 3D MRI method according to a specific embodiment of the present invention.

FIG. 5 is a schematic diagram of a 2D GRAPPA undersampling method used in a 3D MRI method in the prior art; FIG. 6 is a schematic diagram of a first 2D CAIPIRINHA undersampling method used in a 3D MRI method according to a specific embodiment of the present invention; FIG. 7 is a schematic diagram of a second 2D CAIPIRINHA undersampling method used in a 3D MRI method according to a specific embodiment of the present invention.

The first 2D CAIPIRINHA undersampling method used in the 3D MRI method according to a specific embodiment of the present invention comprises the following operations. First of all, a 2D CAIPIRINHA undersampling method is used on k-space data. As FIGS. 5 and 6 show, specifically, the first 2D CAIPIRINHA undersampling method used in the 3D MRI method according to a specific embodiment of the present invention is obtained by taking the 2D GRAPPA undersampling method as a starting point and then performing a staggering operation. Specifically, first of all, as FIG. 5 shows, the use of the 2D GRAPPA undersampling method on k-space data is taken as a starting point, i.e. the acceleration factor in both the PE direction and the SL direction is 2, in other words, undersampling is carried out by extracting every second k-space datum in the PE direction and the SL direction. Next, as FIG. 6 shows, every second sampled k-space datum in the PE direction is staggered by one k-space data unit in the SL direction, in other words, sampled k-space datum 2 between sampled k-space datum 1 and sampled k-space datum 3 in the PE direction is staggered with respect to k-space datum 1 and k-space datum 3 in the SL direction. The same principle applies to k-space data 4, 5 and 6 and k-space data 7, 8 and 9. The acceleration factors in the PE direction and SL direction may be set at will.

Secondly, the undersampled k-space data is extracted. Specifically, as shown in FIGS. 5 and 6, in the process of undersampling k-space data by the 2D GRAPPA undersampling method used in the 3D MRI method in the prior art, the sampled k-space data is extracted from left to right and from top to bottom (or in some other predetermined extraction sequence), so that the extracted k-space data is k-space data 1, 2, 3, 4, 5, 6, 7, 8 and 9, in that order, as FIG. 5 shows. In the process of undersampling k-space data by the first 2D CAIPIRINHA undersampling method used in the 3D MRI method according to a specific embodiment of the present invention, the sampled k-space data is extracted from left to right and from top to bottom, so that the extracted undersampled k-space data is k-space data 1, 3, 2, 4, 6, 5, 7, 9 and 8, in that order, as FIG. 6 shows. Clearly, as a result of the fact that the 2D CAIPIRINHA undersampling method staggers data with respect to the 2D GRAPPA undersampling method, the sequence in which sampling data is extracted is different in the two methods (performing 2D CAIPIRINHA undersampling with other acceleration factors or staggering patterns will give rise to other different data sequences). Different data sequences correspond to different signal attenuation patterns, and therefore will lead to shaking in the reconstructed magnetic resonance image.

The second 2D CAIPIRINHA undersampling method used in the 3D MRI method according to a specific embodiment of the present invention comprises the following operations. First of all, a 2D CAIPIRINHA undersampling method is used on k-space data. As FIG. 7 shows, in the second 2D CAIPIRINHA undersampling method used in the 3D MRI method according to a specific embodiment of the present invention, the first 2D CAIPIRINHA undersampling method used in the 3D MRI method according to a specific embodiment of the present invention is taken as a starting point, and the k-space data is then reorganized. Specifically, as in the dotted line box shown in FIG. 7, the k-space data is reorganized into "data blocks", wherein one "data block" refers to one basic parallel reconstruction data extraction unit, each basic parallel reconstruction data extraction unit comprising one datum to be sampled. Moreover, the size of the basic parallel reconstruction data extraction unit is determined by the acceleration factor in the two phase encoding directions (PE direction and SL direction). In other words, it is a matrix of a number of k-space data equal to the acceleration factor in the first phase encoding direction x a number of k-space data equal to the acceleration factor in the second phase encoding direction. For example: if the acceleration factor in the PE direction is 2, i.e. if undersampling is performed by extracting every second k-space datum in the PE direction, while the acceleration factor in the SL direction is 2, i.e. undersampling is performed by extracting every second k-space datum in the SL direction, then the size of the "data block" should be a unit of 2×2 k-space data. If the acceleration factor in the PE direction is 3, i.e. if undersampling is performed by extracting every third k-space datum in the PE direction, while the acceleration factor in the SL direction is 2, i.e. undersampling is performed by extracting every second k-space datum in the SL direction, then the size of the "data block" should be a unit of 3×2 k-space data. As FIG. 7 shows, if the acceleration factor is 2 in both the PE direction and the SL direction, then the k-space data is reorganized into "data blocks" of size 2×2. The size of the data block may also be a bigger k-space data matrix, for example: if the acceleration factor is 2 in both the PE direction and the SL direction, then the k-space data is reorganized into "data blocks" of size 4×4; it need only be ensured that the extraction of sampling data from k-space data in a "data block" will not lead to a situation where other different data sequences arise because the 2D CAIPIRINHA undersampling method is executed with different acceleration factors or staggering patterns.

Secondly, the undersampled k-space data is extracted. Specifically, as FIG. 7 shows, in the process of undersampling k-space data by the second 2D CAIPIRINHA undersampling method used in the 3D MRI method according to a specific embodiment of the present invention, the "data blocks" of reorganized sampled k-space data are extracted from left to right and from top to bottom (or in some other predetermined sequence), then the undersampled k-space data is extracted from the "data blocks". Thus the undersampled k-space data extracted is the k-space data 1, 2, 3, 4, 5, 6, 7, 8 and 9, in that order, as shown in FIG. 7.

Clearly, after the reorganization, no matter what acceleration factor or staggering pattern is used in the 2D CAIPIRINHA undersampling method, as long as the "data blocks" of reorganized k-space data are extracted from left to right and from top to bottom, the subsequent extraction of sampling data from k-space data in the "data blocks" will not lead to a situation where other different data sequences arise because the 2D CAIPIRINHA undersampling method is executed with different acceleration factors or staggering patterns, so will not lead to different signal attenuation patterns, and therefore will not lead to shaking in the reconstructed magnetic resonance image. In short, "data blocks" formed by such a reorganization method can avoid different extraction sequences caused by displacement in different 2D CAIPIRINHA undersampling methods, and the different signal attenuation patterns which result, and shaking in the reconstructed magnetic resonance image which occurs as a consequence, and can thus improve image quality further.

Next, as FIG. 4 shows, the 3D MRI method according to a specific embodiment of the present invention further comprises: step S103, using the sampling data to reconstruct a magnetic resonance image.

The 3D MRI method according to a specific embodiment of the present invention uses a separate Flash sequence or Spoil GRE sequence for a reference correction scan, to replace the traditional integrated mode calibration scan. The advantage of this is that the reference scan has a more stable signal, and takes less time.

The specific undersampling method used is dependent on the coil and the anatomical position in the scan subject in the practical application. Thus, specific undersampling methods should be designed for different practical applications. In short, it is practical and feasible for the 2D CAIPIRINHA undersampling method with corresponding reorganized "data blocks" to be applied to a 3D scan sequence, in particular a SPACE scan sequence.

Furthermore, since staggering is carried out in the PE or SL direction when the 2D CAIPIRINHA undersampling method is applied to a 3D scan sequence, aliasing in parallel imaging can be controlled, so that a greater area in the center of the field of view (FOV) is undisturbed by aliasing. At the same time, coil sensitivity is increased, enabling further acceleration. Thirdly, the 2D CAIPIRINHA undersampling method generally uses a small acceleration factor, thereby ensuring a high signal to noise ratio. Finally, when the 2D CAIPIRINHA undersampling method is used in an MRI method carried out using a 3D fast spin sequence scan, the time taken to extract k-space data is significantly reduced, thereby shortening the scan time, while the use of "data block" reorganization improves image quality. Thus, as stated above, the application of the 2D CAIPIRINHA undersampling method with corresponding reorganized "data blocks" to a 3D scan sequence, in particular a SPACE scan sequence, significantly improves the comfort of an examination subject as well as the overall image quality thereof.

The embodiments above are merely preferred embodiments of the present invention, and are not intended to limit it. Any amendments, equivalent substitutions or improvements etc. made within the spirit and principles of the present invention should be included in the scope of protection thereof.

We claim as our invention:

1. A magnetic resonance imaging (MRI) method comprising:
    with a computer, operating an MRI apparatus in order to execute a 3D MR scan sequence so as to acquire raw MR data;
    with said computer, controlling entry of the acquired MR raw data into a memory organized as k-space having a plurality of available data entry locations, with 2D CAIPIRINHA undersampling, so that not every available location in k-space is sampled with the acquired MR raw data;
    with said computer, reorganizing the sample data in k-space into a plurality of basic parallel reconstruction data extraction units, each basic parallel reconstruction data extraction unit comprising one location in k-space that is sampled;
    with said computer, extracting said multiple basic parallel reconstruction data acquisition units in a predetermined sequence; and
    with said computer, reconstructing MR image data from the k-space data respectively in the extracted basic parallel reconstruction data extraction units, and making the MR image data available from the computer in electronic form as a data file.

2. A method as claimed in claim 1 comprising selecting said 3D MR scan sequence from the group consisting of a 3D time of flight spoiled gradient echo scan sequence, and a 3D fast spin echo scan sequence.

3. A method as claimed in claim 1 wherein said phase coding direction is a first phase encoding direction, and wherein said 2D CAIPIRINHA undersampling also has an acceleration factor in a second phase encoding direction, and wherein each basic parallel reconstruction data extraction unit is a matrix comprising a plurality of k-space locations in said first phase encoding direction and said second phase encoding direction.

4. A magnetic resonance imaging (MRI) system comprising:
    an MRI apparatus;
    a computer configured to operate the MRI apparatus in order to execute a 3D MR scan sequence so as to acquire raw MR data;
    said computer being configured to control entry of the acquired MR raw data into a memory organized as k-space having a plurality of available data entry locations, with 2D CAIPIRINHA undersampling, so that not every available location in k-space is sampled with the acquired MR raw data;
    said computer being configured to reorganize the sampled data in k-space into a plurality of basic parallel reconstruction data extraction units, each basic parallel reconstruction data extraction unit comprising one location in k-space that is sampled;
    said computer being configured to extract said multiple basic parallel reconstruction data acquisition units in a predetermined sequence; and
    said computer being configured to reconstruct MR image data from the k-space data respectively in the extracted basic parallel reconstruction data extraction units, and to make the MR image data available from the computer in electronic form as a data file.

5. A system as claimed in claim 4 comprising selecting said 3D MR scan sequence from the group consisting of a 3D time of flight spoiled gradient echo scan sequence, and a 3D fast spin echo scan sequence.

6. A system as claimed in claim 4 wherein said phase coding direction is a first phase encoding direction, and wherein said 2D CAIPIRINHA undersampling also has an acceleration factor in a second phase encoding direction, and wherein each basic parallel reconstruction data extraction unit is a matrix comprising a plurality of k-space locations in said first phase encoding direction and said second phase encoding direction.

\* \* \* \* \*